(12) United States Patent
Li et al.

(10) Patent No.: US 10,476,528 B2
(45) Date of Patent: Nov. 12, 2019

(54) DATA PACKET PROCESSING METHOD AND DEVICE

(71) Applicant: ZTE CORPORATION, Shenzhen, Guangdong Province (CN)

(72) Inventors: Liguang Li, Shenzhen (CN); Jun Xu, Shenzhen (CN); Jin Xu, Shenzhen (CN); Zhifeng Yuan, Shenzhen (CN)

(73) Assignee: ZTE CORPORATION (CN)

(*) Notice: Subject to any disclaimer, the term of this patent is extended or adjusted under 35 U.S.C. 154(b) by 105 days.

(21) Appl. No.: 15/509,489

(22) PCT Filed: Mar. 30, 2015

(86) PCT No.: PCT/CN2015/075409
§ 371 (c)(1),
(2) Date: Jul. 7, 2017

(87) PCT Pub. No.: WO2015/184914
PCT Pub. Date: Dec. 10, 2015

(65) Prior Publication Data
US 2017/0324428 A1    Nov. 9, 2017

(30) Foreign Application Priority Data

Sep. 10, 2014   (CN) .......................... 2014 1 0458311

(51) Int. Cl.
*H03M 13/29*    (2006.01)
*H04L 1/00*     (2006.01)
(Continued)

(52) U.S. Cl.
CPC ... *H03M 13/2906* (2013.01); *H03M 13/1102* (2013.01); *H03M 13/1515* (2013.01);
(Continued)

(58) Field of Classification Search
CPC ......... H03M 13/2906; H03M 13/1102; H03M 13/1515; H04L 1/0066; H04L 1/0057;
(Continued)

(56) References Cited

U.S. PATENT DOCUMENTS 5,844,918 A * 12/1998 Kato .................... H03M 13/03
                                                714/751
8,914,714 B2 * 12/2014 Otsuki ............... H04B 7/15521
                                                714/774
(Continued)

FOREIGN PATENT DOCUMENTS

CN       101277144 A    10/2008
CN       101282192 A    10/2008
(Continued)

OTHER PUBLICATIONS

Matthias Woltering, University of Bremen, Bremen, Germany et al., Performance of HARQ with Reduced Size Retransmissions using Network Coding Principles, 2013 IEEE. XP32547842A.

*Primary Examiner* — James C Kerveros
(74) *Attorney, Agent, or Firm* — McDonald Hopkins LLC

(57) ABSTRACT

A packet processing method and device are disclosed. The method includes: performing code block segmentation on a source packet to obtain a sub-packets; performing error correction encoding on each sub-packet respectively, or performing error correction encoding after respectively adding a CRC sequence to each sub-packet to obtain a error correction encoding sub-packets; performing network encoding on the a error correction encoding sub-packet to obtain b check sub-packets; and performing bit selection operation on the a error correction encoding sub-packets and the b check sub-packets respectively to collectively form an encoded packet; herein a and b are integers greater than 0.

18 Claims, 6 Drawing Sheets

(51) Int. Cl.
*H03M 13/11* (2006.01)
*H03M 13/15* (2006.01)
*H04L 1/20* (2006.01)

(52) U.S. Cl.
CPC .......... *H04L 1/0057* (2013.01); *H04L 1/0061* (2013.01); *H04L 1/0066* (2013.01); *H04L 1/0076* (2013.01); *H04L 1/203* (2013.01); *H04L 1/0083* (2013.01)

(58) Field of Classification Search
CPC ..... H04L 1/203; H04L 1/0076; H04L 1/0061; H04L 1/0083
USPC ........................................................ 714/758
See application file for complete search history.

(56) References Cited

U.S. PATENT DOCUMENTS

| | | | |
|---|---|---|---|
| 2007/0101229 A1 | 5/2007 | Niu et al. | |
| 2007/0184826 A1* | 8/2007 | Park | H04B 7/15521 |
| | | | 455/422.1 |
| 2010/0067425 A1 | 3/2010 | Chen et al. | |
| 2012/0239997 A1* | 9/2012 | Otsuki | H04B 7/15521 |
| | | | 714/746 |

FOREIGN PATENT DOCUMENTS

| | | |
|---|---|---|
| CN | 102577167 A | 7/2012 |
| EP | 2472726 A1 | 4/2012 |
| WO | 2013081414 A1 | 6/2013 |

\* cited by examiner

DATA PACKET PROCESSING METHOD AND DEVICE

TECHNICAL FIELD

The present disclosure relates to a data communication transmission technology, and more particularly, to a packet processing method and device.

BACKGROUND

In digital communication systems, especially wired communication systems, such as optical fiber communication, microwave communication, millimeter wave communication, etc., transmission in a communication channel is to transmit packets one by one. With the popularity of data networks and the development of various services, such as the appearance of web page view, video watching, online entertainment, video calls and other needs, a large amount of network traffic is needed. The packets transmitted on the communication channel are relatively large, and each packet is divided into smaller channel code blocks (i.e., code block segmentation) for transmission, so that a channel encoding and decoding module is relatively less complex.

In the communication system, the operating point of a general device requires that when the transmission Bit Error Rate (BLER) is $10^{-1}$, in order to make the communication system work normally, the MAC layer ensures reliable transmission of data by supporting an ARQ mechanism, that is, if the packet transmission has an error, such mechanism ensures reliable transmission of data by repeatedly sending packets. Moreover, in particular, in the unidirectional communication channel, for example, in the transmission of various data in a television broadcasting system, the receiving end can not return the data to the transmitting end, and thus cannot indicate the information about whether the packet is received correctly, and cannot use the ARQ mechanism. In this case, it is necessary to place the operating point of the communication system at the place where the Packet Error Rate (BLER) is relatively low, that is, where a larger SNR is needed (or more energy is sent).

For the future communication systems supporting HARQ (5G wireless communication system), the main scenarios and requirements include direct connection communication D2D, Internet of Things communication MMC, ultra-density network communication UDN, mobile network communication MN and ultra reliable communication UN. In order to meet the new 5G requirements, the future 5G link enhancement technology needs to meet the characteristics of low latency and high throughput, so how to reduce the retransmission number or retransmission delay of HARQ for the future communication systems supporting HARQ is a problem to be solved, herein a very direct and effective solution is to reduce the Packet Error Rate (BLER) at which the packet is transmitted.

Especially for the future communication systems that do not support ARQ, these systems are generally used for a Local Area Network system or some broadcast communication systems, and need relatively low data transmission Bit Error Rate (BLER). According to the digital communication, the relationship between the Packet Error Rate (BLER) and the Bit Error Rate (BCER) is as follows:

$$BLER=1-(1-BCER)^n \approx n \times BCER$$

From the formula, it may be seen that if the packet transmitted by the system is relatively large, there will be a lot of code blocks, which may reach hundreds of or even thousands of code blocks. When it is required that the Packet Error Rate (BLER) is at a lower operating point, an operating point of a Bit Error Rate (BLER) of encoding blocks needs to be lower. The system will need to give a high signal to noise ratio, especially in the case of poor channel conditions, the system efficiency will be very obviously restricted. Therefore, in the communication systems that do not support the ARQ, how to improve the performance BLER for transmitting packets is a problem to be solved.

In short, there is a lack of the encoding solution for large packets which are divided into more encoding blocks in the existing communication systems. How to design a simple and effective encoding solution which has a better Packet Error Rate (BLER) and a lower complexity is a problem to be solved.

SUMMARY

The embodiment of the present disclosure provides a packet processing method and device which may improve the transmission performance of packets.

The packet processing method provided by the embodiment of the present disclosure includes:

performing code block segmentation on a source packet to obtain a sub-packets;

performing error correction encoding on each sub-packet respectively, or performing error correction encoding respectively after adding a CRC sequence to each sub-packet to obtain a error correction encoding sub-packets;

performing network encoding on the a error correction encoding sub-packets to obtain b check sub-packets; and performing bit selection operation on the a error correction encoding sub-packets and the b check sub-packets respectively to collectively form an encoded packet;

Herein, a and b are integers greater than 0.

In an exemplary embodiment, performing bit selection operation on the a error correction encoding sub-packets and the b check sub-packets respectively to collectively form an encoded packet, includes:

selecting codeword bits other than bits indicated by a first set $\{\overline{SETA0}, \overline{SETA1}, \ldots, \overline{SETA(a-1)}\}$ from the a error correction encoding sub-packets, and selecting codeword bits other than bits indicated by a second set $\{\overline{SETP0}, \overline{SETP1}, \ldots, \overline{SETP(b-1)}\}$ from the b check sub-packets, herein all the selected codeword bits forms an encoded packet.

Herein $\overline{SETAi}$ is an index set of bits that are not selected in an i-th error correction encoding sub-packet; $\overline{SETPj}$ is an index set of bits that are not selected in an j-th check sub-packet; and in (a+b) index sets $\{\overline{SETA0}, \overline{SETA1}, \ldots, \overline{SETA(a-1)}, \overline{SETP0}, \overline{SETP1}, \ldots, \overline{SETP(b-1)}\}$, any two different index sets form a set pair, and an intersection of at least h % of set pairs of all $C^2_{a+b}$ set pairs formed in this way is an empty set; i=0, 1, . . . , a−1; j=0, 1, . . . , b−1; h is a real number in [10,100].

In an exemplary embodiment, performing network encoding on the a error correction encoding sub-packets to obtain b check sub-packets, includes:

forming a sequence Sp with a length of a bits with p-th bits of all a error correction encoding sub-packets, p=0, 1, . . . , n−1, where n is an integer greater than 1;

performing single-parity check encoding, b-tuple bit parity check encoding, or an RS encoding on the Sp to obtain a check sequence Tp with a length of b bits; and sequentially combining q-th bits of all check sequences Tps to obtain a parity sub-packet Pq with a length of n bits, q=0, 1, . . . , b−1.

In an exemplary embodiment, the error correction encoding uses LDPC encoding, Turbo encoding or convolutional encoding.

In an exemplary embodiment, a value of the h is equal to 100, 95, 90, 80, 75 or 50.

In an exemplary embodiment, before performing code block segmentation on the source packet, the method further includes: filling the source packet with k' bits so that a length of the filled source packet is divisible by m1, where k' is an integer equal to or greater than 0, and m1 is a predetermined first code block length; or after performing code block segmentation on the source packet to obtain a sub-packets, the method further includes: filling a sub-packets with $k_i$ bits, respectively, so that a length of each filled sub-packet is equal to a predetermined second code block length m2, where $k_i$ is an integer greater than or equal to 0, i=0, 1, ... , a−1; or after obtaining a error correction encoding sub-packets, the method further includes: filling the a error correction encoding sub-packets with $k_j$ bits, respectively, so that a length of each filled error correction encoding sub-packet is equal to a predetermined third code block length m3, where $k_j$ is an integer greater than or equal to 0, j=0, 1, ... , a−1.

In an exemplary embodiment, the bits that are not selected in the a error correction encoding sub-packets do not include the filled bits.

In an exemplary embodiment, the error correction encoding uses the LDPC encoding, the network encoding uses the single-parity check encoding to obtain one check sub-packet P0 with a length of n bits, the index set $\overline{SETAi}$ of bits that are not selected in the i-th error correction encoding sub-packet has a length of $e_i$, the index set $\overline{SETP0}$ of bits that are not selected in the check sub-packet P0 has a length of f0, h=100, and a first index in the index set $\overline{SETAi}$ is equal to a last index in the index set $\overline{SETA(i-1)}$ plus 1; and a first index in the index set $\overline{SETP0}$ is equal to a last index in the index set $\overline{SETA(a-1)}$ plus 1; where $e_i$ and f0 are integers greater than or equal to 0, i=0, 1, ... , a−1, and n is an integer greater than 1.

In an exemplary embodiment, if a is less than or equal to a set threshold A and greater than 1, the length $e_i$ of the index set $\overline{SETAi}$ and the length f0 of the index set $\overline{SETP0}$ are determined in the following manner:

$e_i = E \; i=0,1,\ldots,a-1, f0 = n - \Sigma_{i=0}^{a-1} e_i;$

Where the expression $\Sigma_{c1}^{c2}$ is a summation formula; n is greater than or equal to $\Sigma_{i=0}^{a-1} e_i$, indicating a length of the check sub-packet P0; A is an integer greater than or equal to 2, and E is an integer equal to or greater than 1.

In an exemplary embodiment, if a is greater than the set threshold A, the length $e_i$ of the index set $\overline{SETAi}$ and the length f0 of the index set $\overline{SETP0}$ are determined in the following manner:

$$e_i = \begin{cases} \lfloor n/(a+1) \rfloor + 1, i = 0, 1, \ldots, g-1 \\ \lfloor n/(a+1) \rfloor + 1, i = g, g+1, \ldots, a-1 \end{cases}$$

$g = n - \lfloor n/(a+1) \rfloor \times (a+1),$ $f0 = n - \sum_{i=0}^{a-1} e_i;$ Where the expression $\Sigma_{c1}^{c2}$ is a summation formula; n is equal to or greater than $\Sigma_{i=0}^{a-1} e_i$, indicating the length of the check sub-packet P0; A is an integer greater than or equal to 2.

In an exemplary embodiment, If a=1, the length $e_i$ of the index set $\overline{SETAi}$ and the length f0 of the index set $\overline{SETP0}$ are determined in the following manner:

$e_i = 0 \; i=0,1,\ldots,a-1, f0 = n - \Sigma_{i=0}^{a-1} e_i;$

Where the expression $\Sigma_{c1}^{c2}$ is a summation formula; n is equal to or greater than $\Sigma_{i=0}^{a-1} e_i$, indicating the length of the check sub-packet P0.

In an exemplary embodiment, an encoded packet Y is generated in the following manner:

```
for i = 0,1, ... , a
    for m = h_i, h_i +1, ... , (n_i - e_i - 1)
        if (m < Σ_{k=0}^{i-1} e_k))
            Y_{i,m} = C_{i,m}
        else
            Y_{i,m} = C_{i,m+e_i}
        end if
    end for(m)
end for(i)
```

Where the expression $\Sigma_{c1}^{c2} e_k$ is a summation formula, $e_k$ takes an original value when c2 is greater than or equal to c1, $e_k$ is set as 0 when c2 is less than c1; $h_i$ is an integer greater than or equal to 0, indicating an index of a first non-filled bit in $C_i$; $n_i$ is an integer greater than or equal to $e_i$, indicating a total number of non-filled bits in $C_i$; when i=0, 1, ... , a−1, $C_i$ indicates an error-correction encoding sub-packet including filled bits, when i=a, $C_i$ indicates the check sub-packet P0, $C_{i,m}$ indicates an m-th bit of an i-th sub-packet, $Y_{i,m}$ indicates an m-th bit of an i-th sub-packet included in the packet Y, and a number of the filled bits in $C_i$ is greater than or equal to 0.

In an exemplary embodiment, the A is an integer that takes a value in [10,24].

In an exemplary embodiment, the E is 16, 32, 42, 64, 84, 128, 126 or 256.

Accordingly, an embodiment of the present disclosure provides a packet processing device, including:

a code block segmenting module arranged to perform code block segmentation on a source packet to obtain a sub-packets;

an error correction encoding module arranged to perform error correction encoding on each sub-packet respectively, or perform error correction encoding respectively after adding a CRC sequence to each sub-packet to obtain a error correction encoding sub-packets, where a is an integer greater than 0;

a network encoding module arranged to perform network encoding on the a error correction encoding sub-packets to obtain b check sub-packets, where b is an integer greater than 0; and a bit selecting module arranged to perform bit selection operation on the a error correction encoding sub-packets and the b check sub-packets respectively to collectively form an encoded packet.

In an exemplary embodiment, the bit selecting module performs bit selection operation on the a error correction encoding sub-packets and the b check sub-packets respectively to collectively form an encoded packet, including:

selecting codeword bits other than bits indicated by a first set {$\overline{SETA0}$, $\overline{SETA1}$, ... , $\overline{SETA(a-1)}$} from the a error correction encoding sub-packets, and selecting codeword bits other than bits indicated by a second set {$\overline{SETP0}$, $\overline{SETP1}$, ... , $\overline{SETP(b-1)}$} from the b check sub-packets, where all the selected codeword bits forms an encoded packet.

Herein $\overline{SETAi}$ is an index set of bits that are not selected in an i-th error correction encoding sub-packet; $\overline{SETPj}$ is an index set of bits that are not selected in an j-th check sub-packet; and in (a+b) index sets {$\overline{SETA0}$, $\overline{SETA1}$, ..., $\overline{SETA(a-1)}$, SETP0, SETP1, ..., SETP(b-1)}, any two different index sets form a set pair, and an intersection of at least h % of set pairs of all $C^2_{a+b}$ set pairs formed in this way is an empty set; i=0, 1, ..., a−1; j=0, 1, ..., b−1; h is a real number in [10,100].

In an exemplary embodiment, the network encoding module performs network encoding on the a error correction encoding sub-packets to obtain b check sub-packets, including:

forming a sequence Sp with a length of a bits with p-th bits of all the a error correction encoding sub-packets, p=0, 1, ..., n−1, where n is an integer greater than 1;

performing single-parity check encoding, b-tuple bit parity check encoding, or RS encoding on the Sp to obtain a check sequence Tp with a length of b bits; and Sequentially combining q-th bits of all check sequences Tps to obtain a parity sub-packet Pq with a length of n bits, q=0, 1, ..., b−1.

In an exemplary embodiment, the error correction encoding uses LDPC encoding, Turbo encoding or convolutional encoding.

In an exemplary embodiment, the h used by the bit selecting module is equal to 100, 95, 90, 80, 75 or 50.

In an exemplary embodiment, the device further includes: a bit filling module arranged to fill the source packet with k' bits so that a length of the filled source packet is divisible by m1, where k' is an integer equal to or greater than 0, and m1 is a predetermined first code block length; or arranged to fill a sub-packets obtained by performing code block segmentation on the source packet with $k_{ii}$ bits, respectively, so that a length of each filled sub-packet is equal to a predetermined second code block length m2, where $k_i$ is an integer greater than or equal to 0, i=0, 1, ..., a−1; or arranged to fill the a error correction encoding sub-packets with k bits, respectively, so that a length of each filled error correction encoding sub-packet is equal to a predetermined third code block length m3, where k is an integer greater than or equal to 0, j=0, 1, ..., a−1.

In an exemplary embodiment, bits that are not selected in the a error correction encoding sub-packets determined by the bit selecting module do not include filled bits.

In an exemplary embodiment, the error correction encoding module uses the LDPC encoding, and the network encoding module uses the single-parity check encoding to obtain one check sub-packet P0 with a length of n bits; when the bit selecting module performs bit selection operation, the index set $\overline{SETAi}$ of the bits that are not selected in the i-th error correction encoding sub-packet has a length of $e_i$, the index set $\overline{SETP0}$ of the bits that are not selected in the check sub-packet P0 has a length of f0, h=100, and a first index in the index set $\overline{SETAi}$ is equal to a last index in the index set $\overline{SETA(i-1)}$ plus 1; and a first index in the index set SETP0 is equal to a last index in the index set $\overline{SETA(a-1)}$ plus 1; where $e_i$ and f0 are integers greater than or equal to 0, i=0, 1, ..., a−1, and n is an integer greater than 1.

In an exemplary embodiment, when the bit selecting module performs bit selection operation, if a is less than or equal to a set threshold A and greater than 1, the length $e_i$ of the index set $\overline{SETAi}$ and the length f0 of the index set $\overline{SETP0}$ are determined in the following manner:

$$e_i = E \ i=0,1,\ldots,a-1, f0=n-\Sigma_{i=0}^{a-1}e_i;$$

Where the expression $\Sigma_{c1}^{c2}$ is a summation formula; n is greater than or equal to $\Sigma_{i=0}^{a-1}e_i$, indicating a length of the check sub-packet P0; A is an integer greater than or equal to 2, and E is an integer equal to or greater than 1.

In an exemplary embodiment, when the bit selecting module performs bit selection operation, if a is greater than the set threshold A, the length $e_i$ of the index set $\overline{SETAi}$ and the length f0 of the index set $\overline{SETP0}$ are determined in the following manner:

$$e_i = \begin{cases} \lfloor n/(a+1) \rfloor + 1, i = 0, 1, \ldots, g-1 \\ \lfloor n/(a+1) \rfloor + 1, i = g, g+1, \ldots, a-1 \end{cases}$$

$$g = n - \lfloor n/(a+1) \rfloor \times (a+1),$$

$$f0 = n - \sum_{i=0}^{a-1} e_i;$$

Where the expression $\Sigma_{c1}^{c2}$ is a summation formula; n is equal to or greater than $\Sigma_{i=0}^{a-1}e_i$, indicating the length of the check sub-packet P0; A is an integer greater than or equal to 2.

In an exemplary embodiment, when the bit selecting module performs bit selection operation, if a=1, the length $e_i$ of the index set $\overline{SETAi}$ and the length f0 of the index set $\overline{SETP0}$ are determined in the following manner:

$$e_i = 0 \ i=0,1,\ldots,a-1, f0=n-\Sigma_{i=0}^{a-1}e_i;$$

Where the expression $\Sigma_{c1}^{c2}$ is a summation formula; n is equal to or greater than $\Sigma_{i=0}^{a-1}e_i$, indicating the length of the check sub-packet P0.

In an exemplary embodiment, an encoded packet Y is generated in the following manner:

```
for i = 0,1, ... , a
    for m = h_i, h_i +1, ... , (n_i - e_i - 1)
        if (m < Σ_{k=0}^{i-1} e_k))
            Y_{i,m} = C_{i,m}
        else
            Y_{i,m} = C_{i,m+e_i}
        end if
    end for(m)
end for(i)
```

Where the expression $\Sigma_{c1}^{c2}e_k$ is a summation formula, $e_k$ takes an original value when c2 is greater than or equal to c1, $e_k$ is set as 0 when c2 is less than c1; $h_i$ is an integer greater than or equal to 0, indicating an index of a first non-filled bit in $C_i$; $n_i$ is an integer greater than or equal to $e_i$, indicating a total number of non-filled bits in $C_i$; when i=0, 1, ..., a−1, $C_i$ indicates an error-correction encoding sub-packet including the filled bits, when i=a, $C_i$ indicates the check sub-packet P0, $C_{i,m}$ indicates an m-th bit of an i-th sub-packet, $Y_{i,m}$ indicates an m-th bit of an i-th sub-packet included in the packet Y, and a number of the filled bits in $C_i$ is greater than or equal to 0.

In an exemplary embodiment, the A used by the bit selecting module is an integer that takes a value in [10,24].

In an exemplary embodiment, the E used by the bit selecting module is 16, 32, 42, 64, 84, 128, 126 or 256.

The embodiment of the present disclosure also provides a computer-readable storage medium, in which program instructions are stored, which, when executed, may implement the method described above.

With the abovementioned packet processing method and device, by performing network encoding operation on each encoding sub-packet in the packet, there is a certain correlation between all the encoding sub-packets, so that the decoding may be performed at the receiving end by using the correlation, which may improve the packet transmission performance. By removing some bits in the encoding sub-packet, it is possible to avoid the degradation of the encoding efficiency caused by the network encoding. In the future 5G communication system, especially in the ultra-high-speed communication system (such as microwave, optical communication, etc.), the source packets are generally relatively large, divided into a large number of code blocks, and very suitable for the abovementioned solution using the embodiments of the present disclosure.

Herein the area filled with black in the sub-packets of FIGS. 4 to 8 indicates a portion of the selected bits, the non-filled area indicates a portion of bits which are not selected, and the area filled with oblique lines indicates the filled bit portion.

DETAILED DESCRIPTION

Hereinafter, embodiments of the present disclosure will be described in detail in combination with the accompanying drawings. It should be noted that, in the case of no conflict, embodiments of the present application and the features in the embodiments may be combined with each other arbitrarily.

The First Embodiment

The present embodiment divides a larger source packet into a plurality of sub-packets, and then performs channel error correction encoding on the sub-packets, performs network encoding between the error correction encoding blocks to generate a small number of check (redundancy) sub-packets, and obtains the encoded packet to be sent with the bit selection operating method so as to improve the overall Packet Error Rate (BLER) performance of the packet and reduce the requirement of the Bit Error Rate (BCER).

Figure 1:
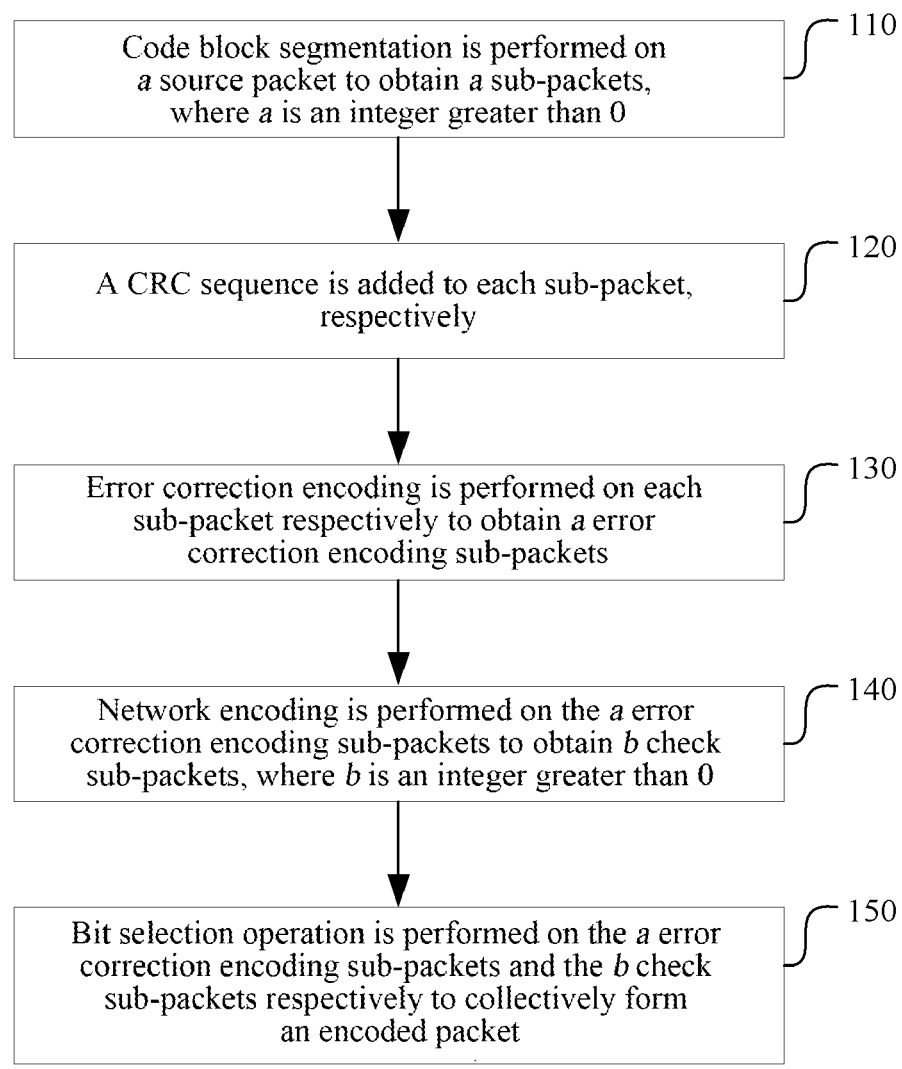
FIG. 1 is a flow diagram of a packet processing method according to the first embodiment of the present disclosure.
Figure 2:
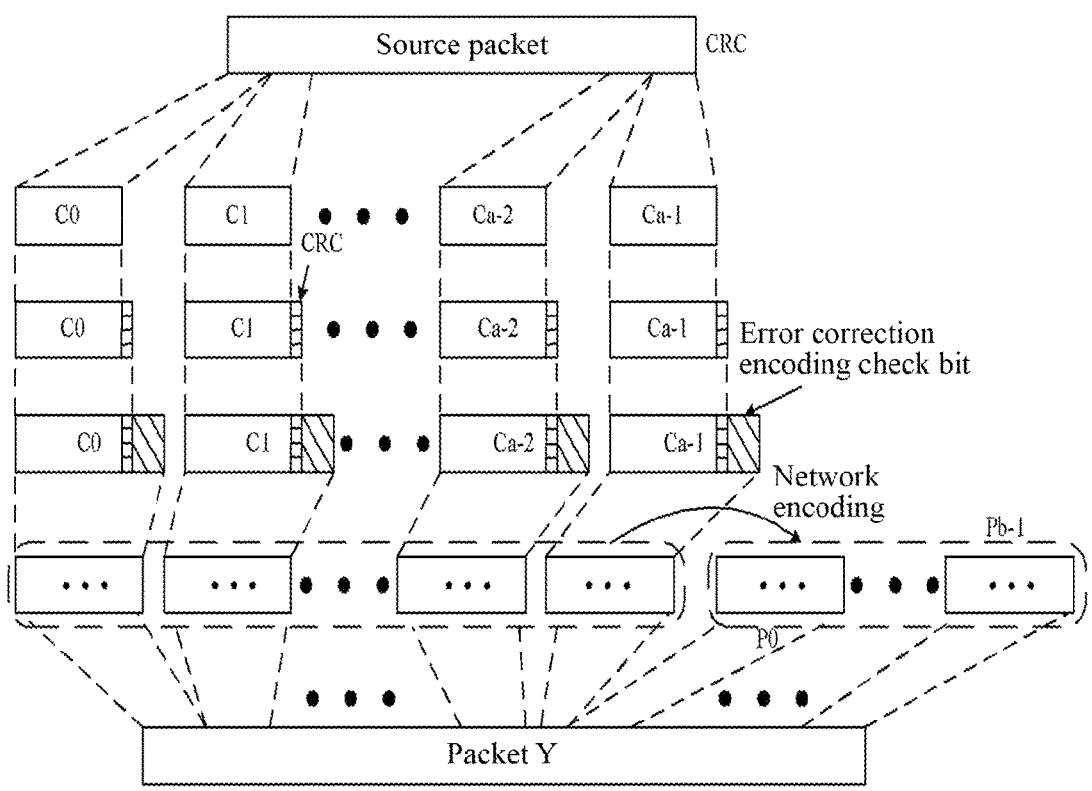
FIG. 2 is a schematic diagram of a data processing process in a packet processing method according to the first embodiment of the present disclosure.
Figure 3:
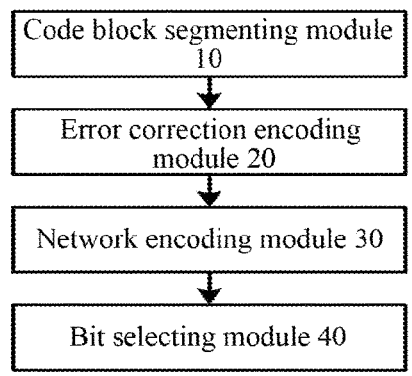
FIG. 3 is a module diagram of a packet processing device according to the first embodiment of the present disclosure.

As shown in FIG. 1, the packet processing method of the present embodiment includes at least the following steps.

In Step 110, Code block segmentation is performed on a source packet to obtain a sub-packets, where a is an integer greater than 0.

If the length of the source packet cannot be divisible by the length the predetermined segmented code block, before performing code block segmentation on the source packet, the method further includes: filling the source packet with k' bits so that the length of the filled source packet is divisible by m1, where k' is an integer equal to or greater than 0, and m1 is a predetermined first code block length.

It is also possible to, after performing code block segmentation on a source packet to obtain a sub-packets, fill a sub-packets with $k_i$ bits, respectively, so that the length of each filled sub-packet is equal to a predetermined second code block length m2, where $k_i$ is an integer greater than or equal to 0, i=0, 1, ..., a−1.

In Step 120, A CRC sequence is added to each sub-packet, respectively.

This step is optional.

In Step 130, Error correction encoding is performed on each sub-packet respectively to obtain a error correction encoding sub-packets.

The sub-packet in this step may be a sub-packet with a CRC sequence added or a sub-packet without a CRC sequence added.

The error correction encoding in this step may use an encoding scheme different from network encoding, such as LDPC encoding, Turbo encoding or convolutional encoding.

It is also possible to, after obtaining a error correction encoding sub-packets, perform the bit filling process, that is: fill the a error correction encoding sub-packets with $k_j$ bits, respectively, so that the length of each filled error correction encoding sub-packet is equal to the predetermined third code block length m3, where $k_j$ is an integer greater than or equal to 0, j=0, 1, ..., a−1.

In Step 140, Network encoding is performed on the a error correction encoding sub-packets to obtain b check sub-packets, where b is an integer greater than 0.

The network encoding in this step may be done in the following manner:

Forming a sequence Sp with a length of a bits with the p-th bits of all a error correction encoding sub-packets, p=0, 1, ..., n−1, where n is an integer greater than 1, and n may be equal to or greater than the length of the a error correction encoding sub-packets;

performing single-parity check encoding, b-tuple bit parity check encoding, or a Reed-Solomon (RS) encoding on the sequence Sp to obtain a check sequence Tp with a length of b bits; and Sequentially combining the q-th bits of all the check sequences Tps to obtain a parity sub-packet Pq with a length of n bits, q=0, 1, . . . , b−1.

The abovementioned single-parity check encoding means that all of the input a information bits form set S, and a binary XOR addition is performed on the set S to obtain one check bit.

The above-mentioned b-tuple bit parity check encoding means that all of the input a information bits form set S, and a binary XOR addition is performed on a subset S1 of the set S to obtain the first check bit; a binary XOR addition is performed on a subset S2 of a new set formed by the set S and the first check bit to obtain the second check bit; a binary XOR addition is performed on a subset S3 of a new set formed by the set S, the first check bit and the second check bit to obtain the third check bit; and similarly, a binary XOR addition is performed on a subset sb of a new set formed by the set S and the previous b−1 check bits to obtain the b-th check bit.

In Step 150, Bit selection operation is performed on the a error correction encoding sub-packets and the b check sub-packets respectively to collectively form an encoded packet.

This step includes:

Selecting codeword bits other than bits indicated by the first set $\{\overline{SETA0}, \overline{SETA1}, \ldots, \overline{SETA(a-1)}\}$ from the a error correction encoding sub-packets, and selecting codeword bits other than bits indicated by the second set $\{\overline{SETP0}, \overline{SETP1}, \ldots, \overline{SETP(b-1)}\}$ from the b check sub-packets, herein all the selected codeword bits form an encoded packet, alternatively, the bits that are not selected in the a error correction encoding sub-packets do not include the filled bits.

Herein $\overline{SETAi}$ is an index set of bits that are not selected in the i-th the error correction encoding sub-packet; $\overline{SETPj}$ is an index set of bits that are not selected in the j-th check sub-packet; and in (a+b) index sets $\{\overline{SETA0}, \overline{SETA1}, \ldots, \overline{SETA(a-1)}, \overline{SETP0}, \overline{SETP1}, \ldots, \overline{SETP(b-1)}\}$, any two different index sets form a set pair, and the intersection of at least h % of set pairs of all $C^2_{a+b}$ set pairs formed in this way is an empty set; i=0, 1, . . . , a−1; j=0, 1, . . . , b−1; h is a real number in [10,100]. For example, h is equal to 100, 95, 90, 80, 75, or 50. The larger the value of h is, the less the index of the bits that are not selected in the sub-packet concentrates on the same position, so that the adverse effects on the decoding due to being too concentrated may be avoided.

In one example of the present embodiment, the error correction encoding uses the LDPC encoding, the network encoding uses the single-parity check encoding to obtain one check sub-packet P0 with a length of n bits, the index set $\overline{SETAi}$ of the bits that are not selected in the i-th error correction encoding sub-packet has a length of $e_i$, the index set $\overline{SETP0}$ of the bits that are not selected in the check sub-packet P0 has a length of f0, h=100, and the first index in the index set $\overline{SETAi}$ is equal to the last index in the index set $\overline{SETA(i-1)}$ plus 1; and the first index in the index set $\overline{SETP0}$ is equal to the last index in the index set $\overline{SETA(a-1)}$ plus 1; where $e_i$ and f0 are integers greater than or equal to 0, i=0, 1, . . . , a−1, and n is an integer greater than 1.

When a is less than or equal to A and greater than 1, the length $e_i$ of the index set $\overline{SETAi}$ and the length f0 of the index set $\overline{SETP0}$ may be determined in the following manner: $e_i$=E i=0, 1, . . . , a−1, f0=n−$\Sigma_{i=0}^{a-1} e_i$; where the expression $\Sigma_{c1}^{c2}$ is a summation formula; n is greater than or equal to $\Sigma_{i=0}^{a-1} e_i$, indicating the length of the check sub-packet P0; A is an integer greater than or equal to 2, and E is an integer equal to or greater than 1.

When a is greater than A, the length $e_i$ of the index set $\overline{SETAi}$ and the length f0 of the index set $\overline{SETP0}$ may be determined in the following manner:

$$e_i = \begin{cases} \lfloor n/(a+1) \rfloor + 1, i = 0, 1, \ldots, g-1 \\ \lfloor n/(a+1) \rfloor + 1, i = g, g+1, \ldots, a-1 \end{cases},$$

$$g = n - \lfloor n/(a+1) \rfloor \times (a+1),$$

$$f0 = n - \sum_{i=0}^{a-1} e_i;$$

When a is equal to 1, the length $e_i$ of the index set $\overline{SETAi}$ and the length f0 of the index set $\overline{SETP0}$ may be determined in the following manner: $e_i$=0 i=0, 1, . . . , a−1, f0=n−$\Sigma_{i=0}^{a-1} e_i$.

Where n is equal to or greater than $\Sigma_{i=0}^{a-1} e_i$, indicating the length of the check sub-packet P0; A is an integer greater than or equal to 2, for example, the A may take the value in the range of [10,24]; and the E is an integer greater than or equal to 1, for example, 16, 32, 42, 64, 84, 128, 126 or 256.

The encoded packet Y may be generated in the following manner:

```
for i = 0,1, ... , a
    for m = h_i, h_i +1, ... , (n_i -e_i -1)
        if (m < Σ_{k=0}^{i-1} e_k))
            Y_{i,m} = C_{i,m}
        else
            Y_{i,m} = C_{i,m+e_i}
        end if
    end for(m)
end for(i)
```

Where the expression $\Sigma_{c1}^{c2} e_k$ is a summation formula, $e_k$ takes an original value when c2 is greater than or equal to c1, $e_k$ is set as 0 when c2 is less than c1; $h_i$ is an integer greater than or equal to 0, indicating the index of the first non-filled bit in $C_i$; $n_i$ is an integer greater than or equal to $e_i$, indicating the total number of non-filled bits in $C_i$; when i=0, 1, . . . , a−1, $C_i$ indicates the error-correction encoding sub-packet including the filled bits, when i=a, $C_i$ indicates the check sub-packet P0, $C_{i,m}$ indicates the m-th bit of the i-th sub-packet, $Y_{i,m}$ indicates the m-th bit of the i-th sub-packet included in the packet Y, and the number of the filled bits in $C_i$ is greater than or equal to 0.

In the above code, for i=0, 1, . . . , a indicates that the bit selection operation is performed on the sub-packet $C_i$ sequentially from $C_0$ to $C_a$. for m=$h_i$, $h_i$+1, . . . , ($n_i$−$e_i$−1) indicates that the mapping relationship between bits $Y_{i,m}$ of the packet Y and bits $C_{i,m}$ in the sub-packet $C_i$ is determined bit-by-bit from the first non-filled bit in $C_i$ when the bit selection operation is performed on the sub-packet $C_i$: if m<$\Sigma_{k=0}^{i-1} e_k$, $Y_{i,m}$=$C_{i,m}$(that is, the m-th bit in the packet $C_i$ is mapped as the m-th bit of the i-th sub-packet contained in the packet Y). If m≥$\Sigma_{k=0}^{i-1} e_k$, $Y_{i,m}$=$C_{i,m+e_i}$ (that is, the (m+ei)-th bit in the packet $C_i$ is mapped as the m-th bit of the i-th sub-packet contained in the packet Y, $e_i$ bits that are not selected are skipped at this time), that is, the bit selection operation is performed on the packet $C_i$ to generate the packet Y, and m takes the value from $h_i$ to $n_i$−$e_i$−1.

Accordingly, a packet processing device provided by the present embodiment includes a code block segmenting module 10, an error correction encoding module 20, a network encoding module 30, a bit selecting module 40.

The code block segmenting module 10 is arranged to perform code block segmentation on a source packet to obtain a sub-packets.

The error correction encoding module 20 is arranged to perform error correction encoding on each sub-packet respectively, or perform error correction encoding respectively after adding a CRC sequence to each sub-packet to obtain a error correction encoding sub-packets, where a is an integer greater than 0; optionally, the error correction encoding uses an encoding method different from network encoding such as LDPC encoding, Turbo encoding or convolutional encoding.

The network encoding module 30 is arranged to perform network encoding on the a error correction encoding sub-packets to obtain b check sub-packets, where b is an integer greater than 0.

The bit selecting module 40 is arranged to perform bit selection operation on the a error correction encoding sub-packets and the b check sub-packets respectively to collectively form an encoded packet.

The bit selecting module 40 performs bit selection operation on the a error correction encoding sub-packets and the b check sub-packets respectively to collectively form an encoded packet, which may include:

Selecting codeword bits other than bits indicated by the first set {$\overline{SETA0}$, $\overline{SETA1}$, ..., $\overline{SETA(a-1)}$} from the a error correction encoding sub-packets, and selecting codeword bits other than bits {$\overline{SETP0}$, $\overline{SETP1}$, ..., $\overline{SETP(b-1)}$} indicated by the second set from the b check sub-packets, here all the selected codeword bits forms an encoded packet.

Herein $\overline{SETAi}$ is an index set of bits that are not selected in the i-th error correction encoding sub-packet; $\overline{SETPj}$ is an index set of bits that are not selected in the j-th check sub-packets; and in (a+b) index sets {$\overline{SETA0}$, $\overline{SETA1}$, ..., $\overline{SETA(a-1)}$ $\overline{SETP0}$, $\overline{SETP1}$, ..., $\overline{SETP(b-1)}$} any two different index sets form a set pair, and the intersection of at least h % of set pairs of all $C^2_{a+b}$ set pairs formed in this way is an empty set; i=0, 1, ..., a-1; j=0, 1, ..., b-1; h is a real number in [10,100], for example, h may be equal to 10, 20, 50 or 100.

The network encoding module 30 is arranged to perform network encoding on the a error correction encoding sub-packets to obtain b check sub-packets, which may include:

Forming a sequence Sp with a length of a bits with the p-th bits of all the a error correction encoding sub-packets, p=0, 1, ..., n-1, where n is an integer greater than 1;

performing single-parity check encoding, b-tuple bit parity check encoding, or RS encoding on the sequence Sp to obtain a check sequence Tp with a length of b bits; and Sequentially combining the q-th bit of all the check sequences Tps to obtain a parity sub-packet Pq with a length of n bits, q=0, 1, ..., b-1.

The packet processing device of the present embodiment may further include: a bit filling module arranged to fill the source packet with k' bits so that the length of the filled source packet is divisible by m, where k' is an integer equal to or greater than 0, and m is a segmented predetermined code block length; or arranged to fill a sub-packets obtained by performing code block segmentation on the source packet with $k_i$ bits, respectively, so that the length of each filled sub-packet is equal to a segmented predetermined code block length m, where $k_i$ is an integer greater than or equal to 0, i=0, 1, ..., a-1. Alternatively, the bits that are not selected in a error correction encoding sub-packets determined by the bit selecting module do not include the filled bits.

In one example, the error correction encoding module 20 uses the LDPC encoding, and the network encoding module 30 uses the single-parity check encoding to obtain one check sub-packet P0 with a length of n bits.

When the bit selecting module 40 performs bit selection operation, the index set $\overline{SETAi}$ of the bits that are not selected in the i-th error correction encoding sub-packet has a length of $e_i$, the index set $\overline{SETP0}$ of the bits that are not selected in the check sub-packets P0 has a length of f0, h=100, and the first index in the index set $\overline{SETAi}$ is equal to the last index in the index set $\overline{SETA(i-1)}$ plus 1; and the first index in the index set $\overline{SETP0}$ is equal to the last index in the index set $\overline{SETA(a-1)}$ plus 1; where $e_i$ and f0 are integers greater than or equal to 0, i=0, 1, ..., a-1, and n is an integer greater than 1.

The length $e_i$ of the index set $\overline{SETAi}$ and the length f0 of the index set $\overline{SETP0}$ are determined in the manner as described above and will not be described here.

The Second Embodiment

In the IEEE802.11aj system, LDPC encoding rate supported by the communication system includes 1/2, 5/8, 3/4, and 13/16, and all the supported code lengths are $N_{ldpc}$=672.

According to the present embodiment, the system currently uses the set channel encoding rate of 1/2, the number of information bits required for the master code of the LDPC code is 336, and 8 bits of the CRC sequence are subtracted to obtain the actual maximum length of 328 of each sub-packet (equivalent to the predetermined first code block length m1). Assuming that the length of the source packet is k=32800 bits, the code block segmentation is performed on the source packet to obtain a=100 sub-packets; a CRC sequence of 8 bits is added to each sub-packet, and the length of each sub-packet becomes 336 bits; LDPC encoding is performed on each sub-packet respectively after adding a CRC sequence of 8 bits to obtain 100 LDPC encoding sub-packets, each has a length of 672 bits and the number of the filled bits is 0; in the network encoding process, a single-parity check encoding method is used to perform network encoding on the 100 LDPC encoding sub-packets to obtain one check sub-packet; and the bit selection operation is performed according to the following rules to obtain the packet Y.

In the index set ($\overline{SETA0}$, $\overline{SETA1}$, ..., $\overline{SETA99}$, $\overline{SETP0}$) of the bits that are not selected in all 100 LDPC encoding sub-packets and one check sub-packet, the intersection of at least 100% of set pairs of all $C^2_{101}$ set pairs is an empty set (that is, the indexes of the bits that are not selected in the different packets are different), where $\overline{SETAi}$ is the index set of the bits that are not selected in the i-th error correction encoding sub-packet, and $\overline{SETPj}$ is the index set of the bits that are not selected in the j-th check sub-packet.

The index set $\overline{SETAi}$ of bits that are not selected of the i-th LDPC encoding sub-packet in all the 100 LDPC encoding sub-packets has a length $e_i$ (i=0, 1, ..., 99) whose value (A is 15, where a is greater than A at this time) is:

When i=0, 1, ..., 65, $e_i$=7;
When i=66, 67, ..., 99, $e_i$=6.

The length f0 of the index set $\overline{SETP0}$ of the bits that are not selected in the check sub-packet P0 has a value of: f0=6.

The index set $\overline{SETAi}$ of the bits that are not selected in the i-th LDPC encoding sub-packet may be expressed as [$(\Sigma_{k=0}^{i-1} ek)$, $(\Sigma_{k=0}^{i-1} ek)+1$, ..., $(\Sigma_{k=0}^{i} ek)-1$]; and the index set $\overline{SETP0}$ of the bits that are not selected in the check sub-packet P0 may be expressed as $[(\Sigma_{k=0}^{a-1}ek), (\Sigma_{k=0}^{a-1}ek)+1, \ldots, (\Sigma_{k=0}^{a-1}ek)+f0-1]$.

Figure 4:
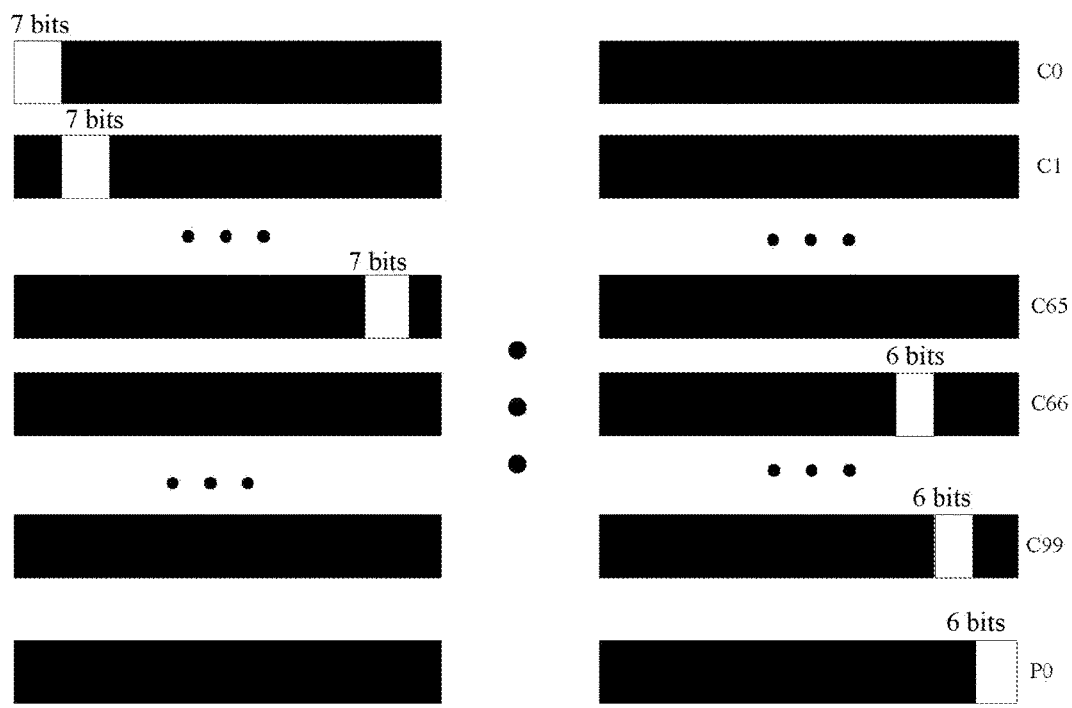
FIG. 4 is a schematic diagram of bits which are not selected and are selected in each of the error correction encoding sub-packets and the check sub-packets in the second embodiment of the present disclosure (there are 100 error correction sub-packets (LDPC), and the bit indexes which are not selected are concentrated).
Figure 5:
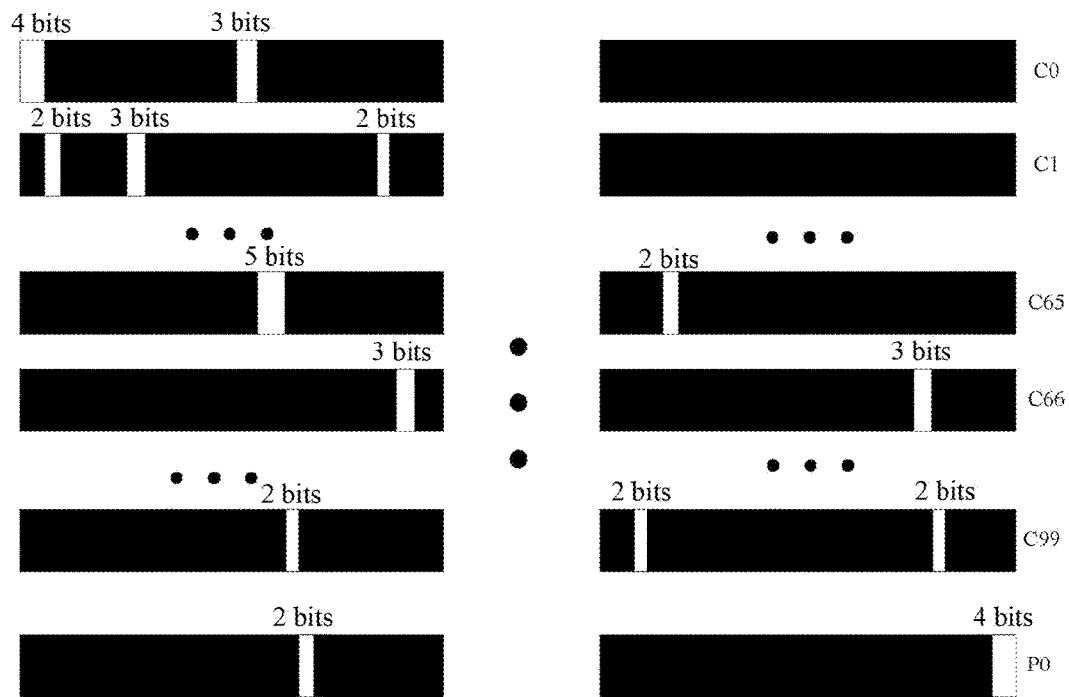
FIG. 5 is a schematic diagram of bits which are not selected and are selected in each of the error correction encoding sub-packets and the check sub-packets in the third embodiment of the present disclosure (there are 100 error correction sub-packets (LDPC), and the bit indexes which are not selected are discrete).

In the 100 LDPC encoding sub-packet and one check sub-packet, the selected and unselected bits are shown in detail in FIG. 4. The indexes of the above unselected bits are continuous (concentrated) in each LDPC encoding sub-packet, which satisfies that: the first index in the index set $\overline{SETAi}$ is equal to the last index in the index set $\overline{SETA(i-1)}$ plus 1; and the first index in the index set $\overline{SETP0}$ is equal to the last index in the index set $\overline{SETA(a-1)}$ plus 1; where $e_i$ and f0 are integers greater than or equal to 0, i=0, 1, ..., a−1, and n is an integer greater than 1. Of course, it is also possible to use a decentralized (discrete) method to determine the bits that are not selected, as shown in FIG. 5.

The sent packet Y is generated in the following manner:

```
for i = 0,1, ... , 100
    for m = h_i,h_i +1, ... , (n_i -e_i -1)
        if (m < Σ_{k=0}^{i-1}e_k))
            Y_{i,m} = C_{i,m}
        else
            Y_{i,m} = C_{i,m+e_i}
        end if
    end for(m)
end for(i)
```

Where the expression $\Sigma_{c1}^{c2} e_k$ is a summation formula, $e_k$ takes an original value when c2 is greater than or equal to c1, $e_k$ is set as 0 when c2 is less than c1; $h_i$ is an integer greater than or equal to 0, indicating the index of the first non-filled bit in $C_i$; $n_i$ is an integer greater than or equal to $e_i$, indicating the total number of non-filled bits in $C_i$; when i=0, 1, ..., a−1, $C_i$ indicates the error-correction encoding sub-packet including the filled bits, when i=a, $C_i$ indicates the check sub-packet P0, $C_{i,m}$ indicates the m-th bit of the i-th sub-packet, $Y_{i,m}$ indicates the m-th bit of the i-th sub-packet included in the packet Y, and the number of the filled bits in $C_i$ is greater than or equal to 0.

The Third Embodiment

In the IEEE802.11aj system, LDPC encoding rate supported by the communication system includes 1/2, 5/8, 3/4, and 13/16, and all the supported code lengths are $N_{ldpc}=672$.

According to the present embodiment, the system currently uses the set channel encoding rate of 13/16, the number of information bits required for the master code of the LDPC code is 546, and 8 bits of the CRC sequence are subtracted to obtain the actual maximum length of 538 of each sub-packet. The length of the source packet is k=5208 bits, the code block segmentation is performed on the source packet to obtain a=10 sub-packets, each of the first eight sub-packets has a size of 521 bits, and each of the last two sub-packets has a size of 520 bits; a CRC sequence of 8 bits is added to each sub-packet respectively; LDPC encoding is performed on each sub-packet respectively after adding a CRC sequence of 8 bits to obtain 10 LDPC encoding sub-packets, where each of the first eight LDPC encoding sub-packets has a size of 647 bits, and each of the last two LDPC encoding sub-packets has a size of 646 bits; in the network encoding process, a single-parity check encoding method is used, to fill all the error correction encoding sub-packets with a total of 2 bits, that is, each of the last two LDPC sub-packets is filled with 1 bit in front respectively, so that all the 10 error correction encoding sub-packets have a length up to 647 bits (equivalent to a predetermined third code block length m3), respectively. The network encoding is performed on the 10 LDPC encoding sub-packets to obtain one check sub-packet with the length of 647 bits; and the bit selection operation is performed according to the following rules to obtain the packet Y.

In the index set ($\overline{SETA0}$, $\overline{SETA1}$, $\overline{SETA9}$, $\overline{SETP0}$) of the bits that are not selected in all the 10 LDPC encoding sub-packets and one check sub-packet, the intersection of at least 100% of set pairs of all the $C_{11}^2$ set pairs is an empty set, where $\overline{SETAi}$ is the index set of the bits that are selected in the i-th error correction encoding sub-packet, $\overline{SETAi}$ is the index set of the bits that are not selected in the i-th error correction encoding sub-packet, $\overline{SETPj}$ is the index set of the bits that are selected in the j-th check sub-packet, and $\overline{SETPj}$ is the index set of the bits that are not selected in the j-th check sub-packet.

The index set $\overline{SETAi}$ of bits that are not selected of the i-th LDPC encoding sub-packet in all the 10 LDPC encoding sub-packets has a length $e_i$ (i=0, 1, ..., 9) whose value (A is 15, where a is less than 15 and greater than 1 at this time) is: $e_i$ (i=0, 1, ..., 9)=42; and the index set $\overline{SETP0}$ of the bits that are not selected in the check sub-packet P0 has a length f0 whose value is: f0=227.

Figure 6:
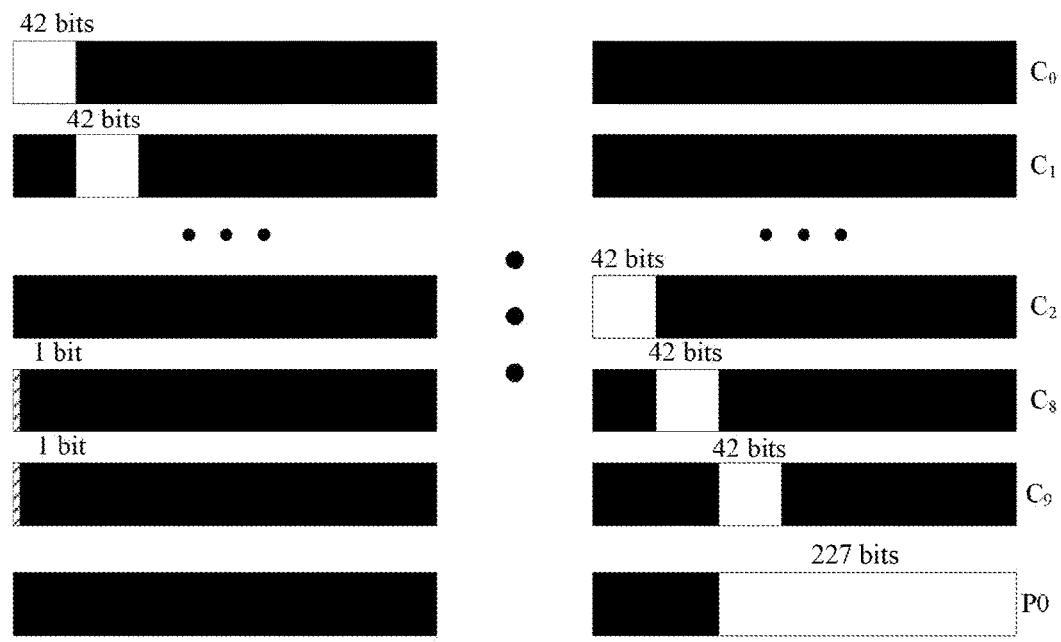
FIG. 6 is a schematic diagram of bits which are not selected and are selected in each of the error correction encoding sub-packets and the check sub-packets in the fourth embodiment of the present disclosure (there are 10 error correction sub-packets (LDPC), and the bit indexes which are not selected are concentrated).
Figure 7:
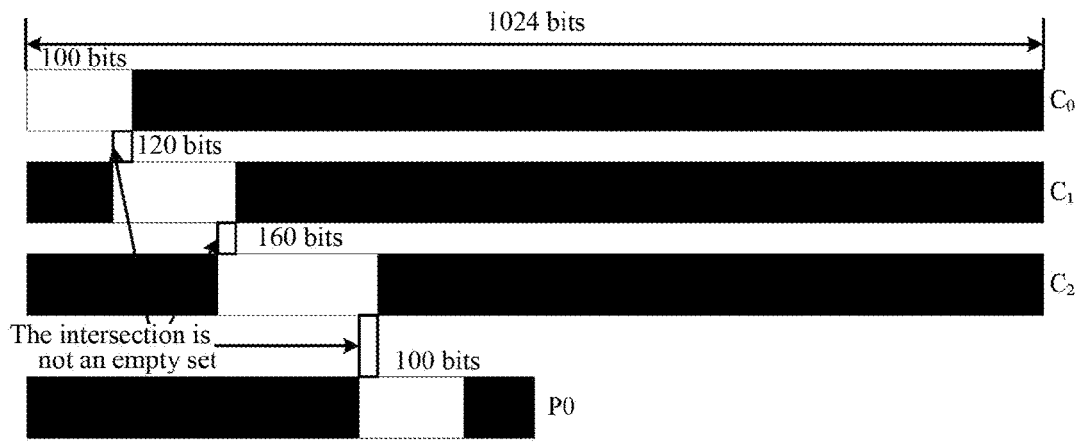
FIG. 7 is a schematic diagram of bits which are not selected and are selected in each of the error correction encoding sub-packets and the check sub-packets in the fifth embodiment of the present disclosure (there are 3 error correction sub-packets (Turbo), and the bit indexes which are not selected are concentrated).
Figure 8:
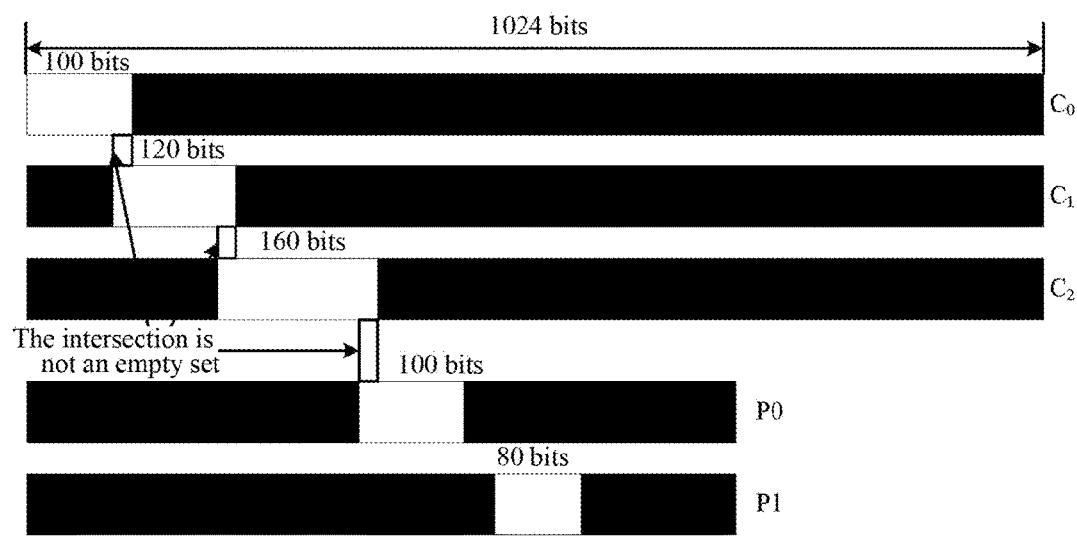
FIG. 8 is a schematic diagram of bits which are not selected and are selected in each of the error correction encoding sub-packets and the check sub-packets in the sixth embodiment of the present disclosure (there are 3 error correction sub-packets (Turbo), the bit indexes which are not selected are concentrated, and a 2-tuple bit parity check coding is used in the network encoding module).

The index set $\overline{SETAi}$ of the bits that are not selected in the i-th LDPC encoding sub-packet is expressed as $[(\Sigma_{k=0}^{i-1}ek), (\Sigma_{k=0}^{i-1}ek)+1, \ldots, (\Sigma_{k=0}^{i}ek)-1]$; and the index set $\overline{SETP0}$ of the bits that are not selected in the check sub-packet P0 is expressed as $[(\Sigma_{k=0}^{a-1}ek), (\Sigma_{k=0}^{a-1}ek)+1, \ldots, (\rho_{k=0}^{a-1}ek)+f0-1]$. In the 10 LDPC encoding sub-packets and one check sub-packet, the selected and unselected bits are shown in FIG. 6. The indexes of the above unselected bits are continuous (concentrated) in each LDPC encoding sub-packet, and of course, a decentralized (discrete) method may be used.

The sent packet Y may be generated in the following manner:

```
for i = 0,1, ... , 10
    for m = h_i,h_i +1, ... , (n_i -e_i -1)
        if (m < Σ_{k=0}^{i-1}e_k))
            Y_{i,m} = C_{i,m}
        else
            Y_{i,m} = C_{i,m+e_i}
        end if
    end for(m)
end for(i)
```

Where the expression $\Sigma_{c1}^{c2} e_k$ is a summation formula, $e_k$ takes an original value when c2 is greater than or equal to c1, $e_k$ is set as 0 when c2 is less than c1; $h_i$ is an integer greater than or equal to 0, indicating the index of the first non-filled bit in $C_i$; $n_i$ is an integer greater than or equal to $e_i$, indicating the total number of non-filled bits in $C_i$; when i=0, 1, ..., a−1, $C_i$ indicates the error-correction encoding sub-packet including the filled bits, when i=a, $C_i$ indicates the check sub-packet P0, $C_{i,m}$ indicates the m-th bit of the i-th sub-packet, $Y_{i,m}$ indicates the m-th bit of the i-th sub-packet included in the packet Y, and the number of the filled bits in $C_i$ is greater than or equal to 0.

The Fourth Embodiment

In the IEEE802.11aj system, LDPC encoding rate supported by the communication system includes 1/2, 5/8, 3/4, and 13/16, and all the supported code lengths are $N_{ldpc}=672$.

According to the present embodiment, the system currently uses the set channel encoding rate of 3/4, the number of information bits required for the master code of the LDPC code is 504, and 8 bits of the CRC sequence are subtracted to obtain the actual maximum length of 496 of each sub-packet. The length of the source packet is k=496 bits, the code block segmentation is performed on the source packet to obtain a=1 sub-packet, the sub-packet has a size of 496 bits; a CRC sequence of 8 bits is added to each sub-packet respectively; LDPC encoding is performed on each sub-packet respectively after adding a CRC sequence of 8 bits to obtain 1 LDPC encoding sub-packet, the sub-packet has a size of 672 bits; in the network encoding process, a single-parity check encoding method is used, the number of filled bits is 0. The network encoding is performed on the 1 LDPC encoding sub-packet to obtain one check sub-packet with the length of 672 bits; and the bit selection operation is performed according to the following rules to obtain the packet Y.

In the index set ($\overline{SETA0}$, $\overline{SETP0}$) of the bits that are not selected in all of the 1 LDPC encoding sub-packet and one check sub-packet, the intersection of at least 100% of set pairs of all the one set pair is an empty set, where SETA0 is the index set of the bits that are selected in the LDPC encoding sub-packet, $\overline{SETA0}$ is the index set of the bits that are not selected in the LDPC encoding sub-packet, SETP0 is the index set of the bits that are selected in the check sub-packets, and $\overline{SETP0}$ is the index set of the bits that are not selected in the check sub-packets; the packet Y is sent.

The index set $\overline{SETA0}$ of the bits that are not selected in the LDPC encoding sub-packet has a length e0 whose value is: e0=0; and the index set $\overline{SETP0}$ of the bits that are not selected in the check sub-packet P0 has a length f0 whose value is: f0=672.

At this point, the packet Y and the LDPC encoding sub-packet are the same.

The Fifth Embodiment

In some communication systems that require Turbo encoding, the packet processing may be performed using a solution in the present embodiment.

According to the present embodiment, the system currently uses the set Turbo encoding rate of 1/2, the code length is 1024 bits, the required number of information bits is 512, and 8 bits of the CRC sequence are subtracted to obtain the actual maximum length of 504 of each sub-packet; assuming that the length of the source packet is k=1512 bits, the code block segmentation is performed on the source packet to obtain a=3 sub-packets; a CRC sequence of 8 bits is added to each sub-packet respectively, the length of each packet becomes 512 bits; Turbo encoding is performed on each sub-packet respectively after adding a CRC sequence to obtain 3 Turbo encoding sub-packets, each has a length of 1024 bits and there is 0 filling bit; in the network encoding process, a single-parity check encoding method is used to perform network encoding on the 3 Turbo encoding sub-packets to obtain 1 check sub-packet of which the length is 512 bits; and the bit selection operation is performed according to the following rules to obtain the packet Y.

In the index set ($\overline{SETA0}$, $\overline{SETA1}$, $\overline{SETA2}$, $\overline{SETP0}$) of the bits that are not selected in all of the 3 Turbo encoding sub-packets and one check sub-packet, the intersection of at least 100% of set pairs of all the $C_4^2$ set pairs is an empty set, where SETAi is the index set of the bits that are selected in the i-th Turbo encoding sub-packet, $\overline{SETAi}$ is the index set of the bits that are not selected in the i-th Turbo encoding sub-packet, SETPj is the index set of the bits that are selected in the j-th check sub-packet, and $\overline{SETPj}$ is the index set of the bits that are not selected in the j-th check sub-packet; the packet Y is sent.

The index set $\overline{SETAi}$ of the bits that are selected in all of the 3 Turbo encoding sub-packets has a length ei (i=0, 1, 2) whose value is: e0=100, e2=120, e2=160; and the index set $\overline{SETP0}$ of the bits that are not selected in the check sub-packet P0 has a length f0 whose value is: f0=100.

The index set $\overline{SETP0}$ of the bits that are not selected in the 0-th Turbo encoding sub-packet is [0, 1, 2, . . . , 99], the index set $\overline{SETA1}$ of the bits that are not selected in the first Turbo encoding sub-packet is [90, 91, 92, . . . , 209], the index set $\overline{SETA2}$ of the bits that are not selected in the second Turbo encoding sub-packet is [200, 201, 202, . . . , 359]; the index set $\overline{SETP0}$ of the bits that are not selected in the check sub-packet P0 is [350, 351, 352, . . . , 449]; the remaining selected bits belong to the data of the packet Y to be sent. In the 3 Turbo encoding sub-packets and 1 check sub-packet, the selected and unselected bits are shown in detail in FIG. 7.

The indexes of the unselected bits described above are continuous (concentrated) in each Turbo encoding sub-packet, and of course, a decentralized (discrete) method may be used.

The Sixth Embodiment

In some communication systems that require Turbo encoding, the packet processing may be performed using a solution in the present embodiment.

According to the present embodiment, the system currently uses the set Turbo encoding rate of 1/2, the code length is 1024 bits, the required number of information bits is 512, and 8 bits of the CRC sequence are subtracted to obtain the actual maximum length of 504 of each sub-packet; assuming that the length of the source packet is k=1512 bits, the code block segmentation is performed on the source packet to obtain a=3 sub-packets; a CRC sequence of 8 bits is added to each sub-packet respectively, the length of each packet becomes 512 bits; Turbo encoding is performed on each sub-packet respectively after adding a CRC sequence to obtain 3 Turbo encoding sub-packets, each has a length of 1024 bits and there is 0 filling bit; in the network encoding process, 2-tuple bit parity check encoding method is used to perform network encoding on the 3 Turbo encoding sub-packets to obtain 2 check sub-packets, each has a length of 701 bits; and the bit selection operation is performed according to the following rules to obtain the packet Y.

The index set $\overline{SETAi}$ of the bits that are selected in all of the 3 Turbo encoding sub-packets has a length ei (i=0, 1, 2) whose value is: e0=100, e2=120, e2=160; and the index set $\overline{SETPj}$ of the bits that are not selected in 2 check sub-packets has a length fj (j=0, 1) whose value is: f0=100, f1=80.

The index set $\overline{SETP0}$ of the bits that are not selected in the 0-th Turbo encoding sub-packet is [0, 1, 2, . . . , 99], the index set $\overline{SETA1}$ of the bits that are not selected in the first Turbo encoding sub-packet is [90, 91, 92, . . . , 209], the index set $\overline{SETA2}$ of the bits that are not selected in the second Turbo encoding sub-packet is [200, 201, 202, . . . , 359]; the index set $\overline{SETP0}$ of the bits that are not selected in the 0-th check sub-packet P0 is [350, 351, 352, . . . , 449], and the index set $\overline{SETP1}$ of the bits that are not selected in the first check sub-packet P1 is [470, 471, 472, . . . , 549]; the remaining selected bits belong to the data of the packet Y to be sent. In the 3 Turbo encoding sub-packets and 2 check sub-packets, the selected and unselected bits are shown in detail in FIG. 8.

The indexes of the unselected bits described above are continuous (concentrated) in each Turbo encoding sub-packet, and of course, a decentralized (discrete) method may be used.

The Seventh Embodiment

In some communication systems that require other encoding, the error correction encoding method such as convolutional encoding or RS encoding is used, and the method according to the embodiment of the present disclosure may also be used to perform the packet process. The described method is basically the same as the above embodiment.

Figure 9:
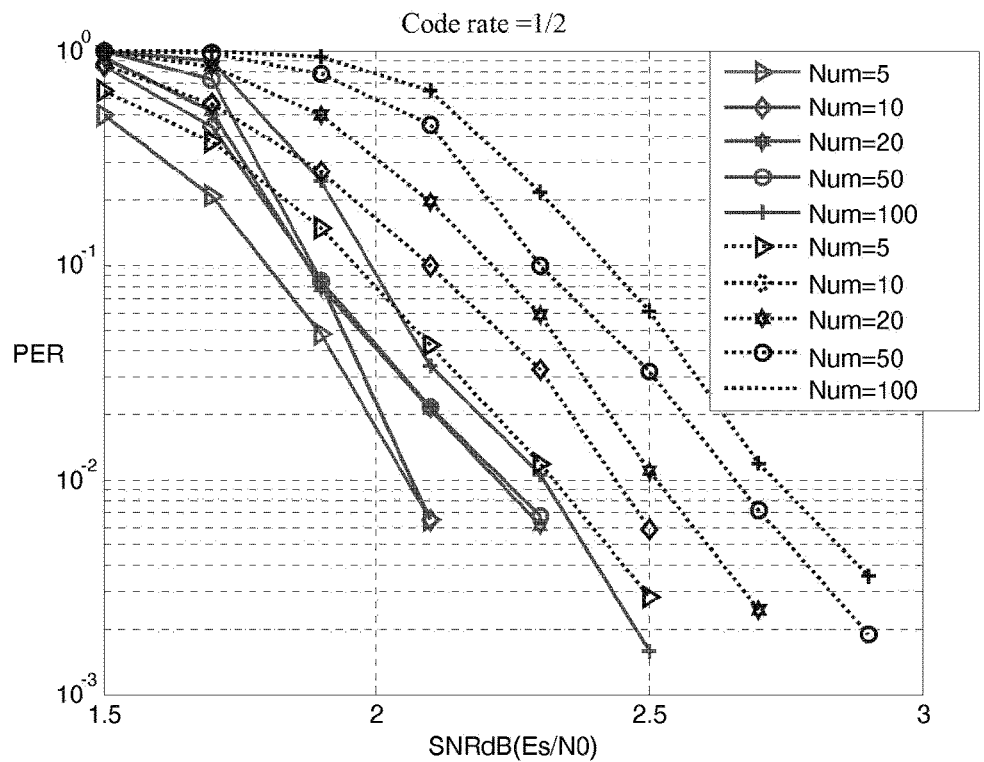
FIG. 9 is a schematic diagram of the encoding performance gain when the code rate is 1/2 in the embodiment of the present disclosure.
Figure 10:
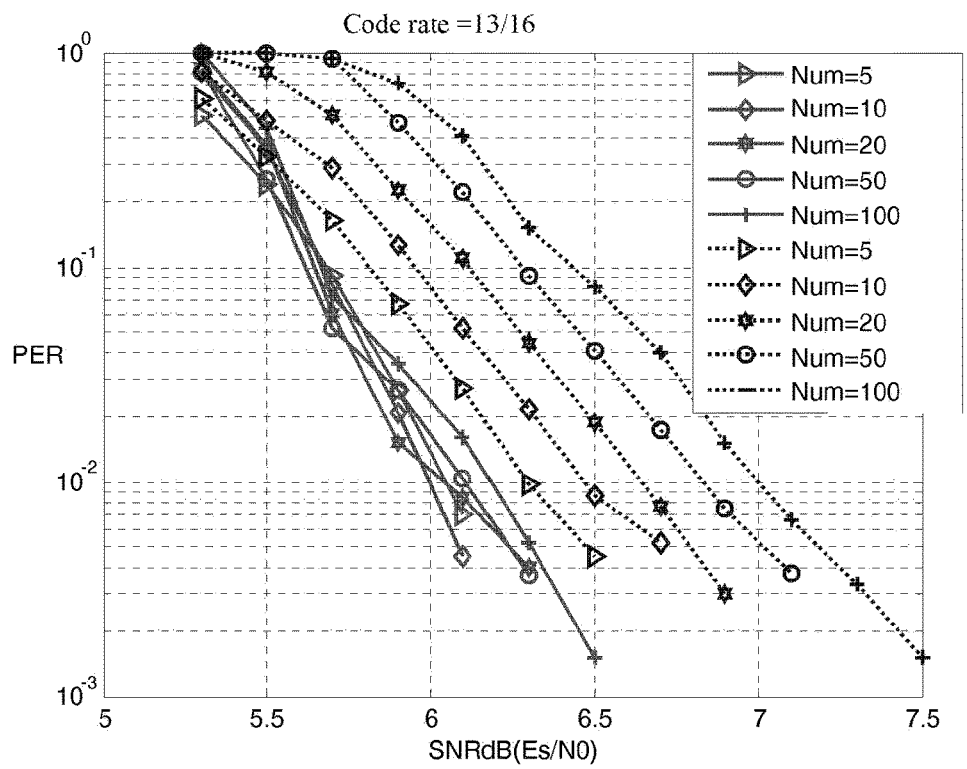
FIG. 10 is a schematic diagram of the encoding performance gain when the code rate is 13/16 in the embodiment of the present disclosure.

FIG. 9 and FIG. 10 show the performance gains when the code rate is 1/2 and the code rate is 13/16 in the embodiment of the present disclosure, respectively. At the same time, the simulation results of the traditional solution and the present embodiment solution are given to facilitate the performance comparison. The solid line is the simulation result of the embodiment of the present disclosure, and the dashed line is the simulation result of the traditional solution. The simulation results show that the technical solution of the embodiment of the present disclosure achieves a larger performance gain while maintaining the same conditions. In particular, the greater the number of the error correction encoding sub-packets of the source packet is, the greater the performance gain is. A great advance in technology is shown.

The method and device supporting the improvement of packet transmission performance described in the embodiment of the present disclosure may also be stored in a computer-readable storage medium if implemented in the form of a software function module and sold or used as a separate product. Based on this understanding, those skilled in the art should understand that the embodiments in the present application can provide a method, a system or a computer program product. Thus, forms of hardware embodiments, software embodiments or embodiments integrating software and hardware can be adopted in the present application. Moreover, a form of the computer program product implemented on one or more computer available storage media (including, but not limited to, a USB disk, a mobile hard disk, a Read-Only Memory (ROM), a disk memory, CD-ROM, an optical memory, and the like) containing computer available program codes can be adopted in the present application.

The present application is described with reference to flowcharts and/or block diagrams of the method, the equipment (system) and the computer program product according to the embodiments of the present application. It should be understood that each flow and/or block in the flowcharts and/or the block diagrams and a combination of the flows and/or the blocks in the flowcharts and/or the block diagrams can be realized by computer program instructions. These computer program instructions can be provided for a general computer, a dedicated computer, an embedded processor or processors of other programmable data processing devices to generate a machine, so that an apparatus for realizing functions assigned in one or more flows of the flowcharts and/or one or more blocks of the block diagrams is generated via instructions executed by the computers or the processors of the other programmable data processing devices.

These computer program instructions can also be stored in a computer readable memory capable of guiding the computers or the other programmable data processing devices to work in a specific mode, so that a manufactured product including an instruction apparatus is generated via the instructions stored in the computer readable memory, and the instruction apparatus realizes the functions assigned in one or more flows of the flowcharts and/or one or more blocks of the block diagrams.

These computer program instructions can also be loaded onto the computers or the other programmable data processing devices, so that processing realized by the computers is generated by executing a series of operation steps on the computers or the other programmable devices, and therefore the instructions executed on the computers or the other programmable devices provide a step of realizing the functions assigned in one or more flows of the flowcharts and/or one or more blocks of the block diagrams.

Accordingly, an embodiment of the present disclosure further provides a computer storage medium in which a computer program is stored for executing the method and device for supporting the improvement of the packet transmission performance according to an embodiment of the present disclosure.

The above description is only for alternative embodiments of the present disclosure, and is not intended to limit the scope of protection of the present disclosure.

INDUSTRIAL APPLICABILITY

The embodiments of the present disclosure may improve the packet transmission performance.

What is claimed is:

1. A processing method for large packet which is transmitted in a communication system, comprising:
performing code block segmentation on a source large packet to obtain $\alpha$ sub-packets;
performing error correction encoding on each sub-packet respectively, or performing error correction encoding respectively after adding a Cyclic Redundancy Check, CRC, sequence to each sub-packet to obtain $\alpha$ error correction encoding sub-packets;
performing network encoding on the $\alpha$ error correction encoding sub-packets to obtain $\beta$ check sub-packets;
performing bit selection operation on the $\alpha$ error correction encoding sub-packets and the $\beta$ check sub-packets respectively to collectively form an encoded packet;
wherein, $\alpha$ and $\beta$ are integers greater than 0; and
sending the encoded packet;
wherein:
performing bit selection operation on the $\alpha$ error correction encoding sub-packets and the $\beta$ check sub-packets respectively to collectively form an encoded packet, comprises:
selecting codeword bits from the $\alpha$ error correction encoding sub-packets and the $\beta$ check sub-packets to form an encoded packet, wherein the bits which are not selected are indicated by a first set $\{\overline{SETA0}, \overline{SETA1}, \ldots, \overline{SETA(\alpha-1)}\}$ from the $\alpha$ error correction encoding sub-packets and are part of the $\alpha$ error correction encoding sub-packets, and the bits which are not selected are indicated by a second set $\{\overline{SETP0}, \overline{SETP1}, \ldots, \overline{SETP(\beta-1)}\}$ for the $\beta$ check sub-packets and are part of the $\beta$ error correction encoding sub-packets;
wherein $\overline{SETAi}$ is an index set of bits that are not selected in an i-th error correction encoding sub-packet; $\overline{SETPj}$ is an index set of bits that are not selected in an j-th check sub-packet; and in $\alpha+\beta$ index sets $\{\overline{SETA0}, \overline{SETA1}, \ldots, \overline{SETA(\alpha-1)}, \overline{SETP0}, \overline{SETP1}, \ldots, \overline{SETP(\beta-1)}\}$, any two different index sets form a set pair, and an intersection of at least h % of set pairs of all $C^2_{\alpha+\beta}$ set pairs formed in this way is an empty set; i=0, 1, \ldots, $\alpha-1$; j=0, 1, \ldots, $\beta-1$; h is a real number in [10,100].

2. The method according to claim 1, wherein:
performing network encoding on the $\alpha$ error correction encoding sub-packets to obtain $\beta$ check sub-packets, comprises:
forming a sequence Sp with a length of $\alpha$ bits with p-th bits of all $\alpha$ error correction encoding sub-packets, p=0, 1, \ldots, n-1, where n is an integer greater than 1;

performing single-parity check encoding, β-tuple bit parity check encoding, or Reed-Solomon, RS, encoding on the sequence Sp to obtain a check sequence Tp with a length of β bits; and sequentially combining q-th bits of all check sequences Tps to obtain a parity sub-packet Pq with a length of n bits, q=0, 1, . . . , β−1, and, wherein, the error correction encoding uses Low Density Parity Check Code, LDPC, encoding, Turbo encoding or convolutional encoding.

3. The method according to claim 1, wherein:
a value of the his equal to 100, 95, 90, 80, 75 or 50, and bits that are not selected in the α error correction encoding sub-packets do not comprise filled bits.

4. The method according to claim 1, wherein:
the error correction encoding uses the LDPC encoding, the network encoding uses the single-parity check encoding to obtain one check sub-packet P0 with a length of n bits, the index set $\overline{SETAi}$ of bits that are not selected in the i-th error correction encoding sub-packet has a length of $e_i$, the index set $\overline{SETP0}$ of bits that are not selected in the check sub-packet P0 has a length of f0, h=100, and a first index in the index set $\overline{SETAi}$ is equal to a last index in the index set $\overline{SETA(i-1)}$ plus 1; and a first index in the index set $\overline{SETP0}$ is equal to a last index in the index set $\overline{SETA(\alpha-1)}$ plus 1; where $e_i$ and f0 are integers greater than or equal to 0, i=0, 1, . . . , α−1, and n is an integer greater than 1.

5. The method according to claim 4, wherein:
when α is less than or equal to a set threshold A and greater than 1, the length $e_i$ of the index set $\overline{SETAi}$ and the length f0 of the index set $\overline{SETP0}$ are determined in the following manner:

$$e_i=E, i=0,1,\ldots,\alpha-1, f0=n-\Sigma_{i=0}^{\alpha-1}e_i;$$

where the expression $\Sigma_{c1}^{c2}$ is a summation formula; n is greater than or equal to $\Sigma_{i=0}^{\alpha-1}e_i$, indicating a length of the check sub-packet P0 ; A is an integer greater than or equal to 2, and E is an integer equal to or greater than 1, or, wherein:

when α is greater than the set threshold A, the length $e_i$ of the index set $\overline{SETAi}$ and the length f0 of the index set $\overline{SETP0}$ are determined in the following manner:

$$e_i = \begin{cases} \lfloor n/(a+1) \rfloor + 1, i = 0, 1, \ldots, g-1 \\ \lfloor n/(a+1) \rfloor + 1, i = g, g+1, \ldots, a-1 \end{cases}$$

$$g = n - \lfloor n/(a+1) \rfloor \times (a+1),$$

$$f0 = n - \sum_{i=0}^{a-1} e_i;$$

where the expression $\Sigma_{c1}^{c2}$ is a summation formula; n is equal to or greater than $\Sigma_{i=0}^{\alpha-1}e_i$, indicating the length of the check sub-packet P0 ; A is an integer greater than or equal to 2, or, wherein:

when α=1, the length ei of the index set $\overline{SETAi}$ and the length f0 of the index set $\overline{SETP0}$ are determined in the following manner:

$$e_i=0, i=0,1,\ldots,\alpha-1, f0=n-\Sigma_{i=0}^{\alpha-1}e_i;$$

where the expression $\Sigma_{c1}^{c2}$ is a summation formula; n is equal to or greater than $\Sigma_{i=0}^{\alpha-1}e_i$; indicating the length of the check sub-packet P0.

6. The method according to claim 5, wherein:
an encoded packet Y is generated in the following manner:

```
for i = 0,1, ... , a
  for m = h_i, h_i +1, ... , (n_i −e_i −1)
    if (m < Σ_{k=0}^{i-1} e_k ))
      Y_{i,m} = C_{i,m}
    else
      Y_{i,m} = C_{i,m+e_i}
    end if
  end for(m)
end for(i)
``` where the expression $\Sigma_{c1}^{c2} e_k$ is a summation formula, $e_k$ takes an original value when c2 is greater than or equal to c1, $e_k$ is set as 0 when c2 is less than c1; $h_i$ is an integer greater than or equal to 0, indicating an index of a first non-filled bit in $C_i$; $n_i$ is an integer greater than or equal to $e_i$, indicating a total number of non-filled bits in $C_i$; when i=0, 1, . . . , α−1, $C_i$ indicates an error-correction encoding sub-packet comprising filled bits, when i=a, $C_i$ indicates the check sub-packet P0, $C_{i,m}$ indicates an m-th bit of an i-th sub-packet, $Y_{i,m}$ indicates an m-th bit of an i-th sub-packet comprised in the packet Y, and a number of the filled bits in $C_i$ is greater than or equal to 0.

7. The method according to claim 5, wherein:
the A is an integer that takes a value in [10,24].

8. The method according to claim 5, wherein:
the E is 16, 32, 42, 64, 84, 128, 126 or 256.

9. A computer-readable storage medium, in which program instructions are stored, which, when executed, implement the method according to claim 1.

10. A processing device for large packet which is transmitted in a communication system, comprising:
a code block segmenting module arranged to perform code block segmentation on a source large packet to obtain α sub-packets;
an error correction encoding module arranged to perform error correction encoding on each sub-packet respectively, or perform error correction encoding respectively after adding a CRC sequence to each sub-packet to obtain α error correction encoding sub-packets, where α is an integer greater than 0;
a network encoding module arranged to perform network encoding on the α error correction encoding sub-packets to obtain β check sub-packets, where β is an integer greater than 0;
a bit selecting module arranged to perform bit selection operation on the α error correction encoding sub-packets and the β check sub-packets respectively to collectively form an encoded packet; and
a sending module arranged to send the encoded packet;
wherein:
the bit selecting module is arranged to perform bit selection operation on the α error correction encoding sub-packets and the β check sub-packets respectively in the following manner to collectively form an encoded packet:
selecting codeword bits from the α error correction encoding sub-packets and the β check sub-packets to form an encoded packet, wherein the bits which are not selected are indicated by a first set {$\overline{SETA0}$, $\overline{SETA1}, \ldots, \overline{SETA(\alpha-1)}\}$ for the α error correction encoding sub-packets and are part of the α error correction encoding sub-packets, and the bits which are not selected are indicated by a second set $\{\overline{SETP0}, \overline{SETP1}, \ldots, \overline{SETP(\beta-1)}\}$ for the β check sub-packets and are part of the β error correction encoding sub-packets;

wherein $\overline{SETAi}$ is an index set of bits that are not selected in an i-th error correction encoding sub-packet; $\overline{SETPj}$ is an index set of bits that are not selected in an j-th check sub-packet; and in α+β index sets $\{\overline{SETA0}, \overline{SETA1}, \ldots, \overline{SETA(\alpha-1)}, \overline{SETP0}, \overline{SETP1}, \ldots, \overline{SETP(\beta-1)}\}$, any two different index sets form a set pair, and an intersection of at least h % of set pairs of all $C^2_{\alpha+\beta}$ set pairs formed in this way is an empty set; i=0, 1, ..., α−1; j=0, 1, ..., β−1;

h is a real number in [10,100].

11. The device according to claim 10, wherein:
the network encoding module is arranged to perform network encoding on the α error correction encoding sub-packets in the following manner to obtain b check sub-packets:
forming a sequence Sp with a length of α bits with p-th bits of all the α error correction encoding sub-packets, p=0, 1, ..., n−1, where n is an integer greater than 1;
performing single-parity check encoding, β-tuple bit parity check encoding, or RS encoding on the sequence Sp to obtain a check sequence Tp with a length of β bits; and
sequentially combining q-th bits of all check sequences Tps to obtain a parity sub-packet Pq with a length of n bits, q=0, 1, ..., β−1,
and,
wherein, the error correction encoding uses Low Density Parity Check Code, LDPC, encoding, Turbo encoding or convolutional encoding.

12. The device according to claim 10, wherein:
the h used by the bit selecting module is equal to 100, 95, 90, 80, 75 or 50.

13. The device according to claim 10, wherein:
the device further comprises: a bit filling module arranged to fill the source packet with k' bits so that a length of the filled source packet is divisible by m1, where k' is an integer equal to or greater than 0, and m1 is a predetermined first code block length; or
arranged to fill α sub-packets obtained by performing code block segmentation on the source packet with $k_i$ bits, respectively, so that a length of each filled sub-packet is equal to a predetermined second code block length m2, where $k_i$ is an integer greater than or equal to 0, i=0, 1, ..., α−1; or
arranged to fill the α error correction encoding sub-packets with $k_j$ bits, respectively, so that
a length of each filled error correction encoding sub-packet is equal to a predetermined third code block length m3, where $k_j$ is an integer greater than or equal to 0, j=0, 1, ..., α−1,
and,
wherein, bits that are not selected in the α error correction encoding sub-packets determined by the bit selecting module do not comprise filled bits.

14. The device according to claim 10, wherein:
the error correction encoding module uses the LDPC encoding, and the network encoding module uses the single-parity check encoding to obtain one check sub-packet P0 with a length of n bits;

when the bit selecting module performs bit selection operation, the index set $\overline{SETAi}$ of bits that are not selected in the i-th error correction encoding sub-packet has a length of $e_i$, the index set $\overline{SETP0}$ of bits that are not selected in the check sub-packet P0 has a length of f0 , h=100, and a first index in the index set $\overline{SETAi}$ is equal to a last index in the index set $\overline{SETA(i-1)}$ plus 1; and a first index in the index set $\overline{SETP0}$ is equal to a last index in the index set $\overline{SETA(\alpha-1)}$ plus 1; where $e_i$ and f0 are integers greater than or equal to 0, i=0, 1, ..., α−1, and n is an integer greater than 1.

15. The device according to claim 14, wherein:
when the bit selecting module performs bit selection operation, when α is less than or equal to a set threshold A and greater than 1, the length $e_i$ of the index set $\overline{SETAi}$ and the length f0 of the index set $\overline{SETP0}$ are determined in the following manner:

$$e_i = E, i=0,1, \ldots, \alpha-1, f0 = n - \Sigma_{i=0}^{\alpha-1} e_i;$$

where the expression $\Sigma_{c1}^{c2}$ is a summation formula; n is greater than or equal to $\Sigma_{i=0}^{\alpha-1} e_i$, indicating a length of the check sub-packet P0; A is an integer greater than or equal to 2, and E is an integer equal to or greater than 1,
or,
wherein:
when the bit selecting module performs bit selection operation, when α is greater than the set threshold A, the length $e_i$ of the index set $\overline{SETAi}$ and the length f0 of the index set $\overline{SETP0}$ are determined in the following manner:

$$e_i = \begin{cases} \lfloor n/(a+1) \rfloor + 1, i = 0, 1, \ldots, g-1 \\ \lfloor n/(a+1) \rfloor + 1, i = g, g+1, \ldots, a-1 \end{cases}$$

$$g = n - \lfloor n/(a+1) \rfloor \times (a+1),$$

$$f0 = n - \sum_{i=0}^{a-1} e_i;$$

where the expression $\Sigma_{c1}^{c2}$ is a summation formula; n is equal to or greater than $\Sigma_{i=0}^{\alpha-1} e_i$, indicating the length of the check sub-packet P0; A is an integer greater than or equal to 2,
or,
wherein:
when the bit selecting module performs bit selection operation, when α=1, the length $e_i$ of the index set $\overline{SETAi}$ and the length f0 of the index set $\overline{SETP0}$ are determined in the following manner:

$$e_i = 0, i=0,1, \ldots, \alpha-1, f0 = n - \Sigma_{i=0}^{\alpha-1} e_i;$$

where the expression $\Sigma_{c1}^{c2}$ is a summation formula; n is equal to or greater than $\Sigma_{i=0}^{\alpha-1} e_i$, indicating the length of the check sub-packet P0.

16. The device according to claim 15, wherein:
an encoded packet Y is generated in the following manner:

```
for i = 0,1, ... , a
    for m = h_i, h_i +1, ... , (n_i - e_i - 1)
        if (m < Σ_{k=0}^{i-1} e_k))
            Y_{i,m} = C_{i,m}
        else
            Y_{i,m} = C_{i,m+e_i}
```

```
          end if
        end for(m)
      end for(i)
``` where the expression $\Sigma_{c1}^{c2} e_k$ is a summation formula, $e_k$ takes an original value when c2 is greater than or equal to c1, $e_k$ is set as 0 when c2 is less than c1; $h_i$ is an integer greater than or equal to 0, indicating an index of a first non-filled bit in $C_i$; $n_i$ is an integer greater than or equal to $e_i$, indicating a total number of non-filled bits in $C_i$; when i=0, 1, . . . , α−1, $C_i$ indicates an error-correction encoding sub-packet comprising filled bits, when i=α, $C_i$ indicates the check sub-packet P0, $C_{i,m}$ indicates an m-th bit of an i-th sub-packet, $Y_{i,m}$ indicates an m-th bit of an i-th sub-packet comprised in the packet Y, and a number of the filled bits in $C_i$ is greater than or equal to 0.

17. The device according to claim 15, wherein:
the A used by the bit selecting module is an integer that takes a value in [10,24].

18. The device according to claim 15, wherein:
the E used by the bit selecting module is 16, 32, 42, 64, 84, 128, 126 or 256.

* * * * *